(12) United States Patent
Matsumoto

(10) Patent No.: US 6,436,316 B2
(45) Date of Patent: Aug. 20, 2002

(54) CONDUCTIVE PASTE AND PRINTED WIRING BOARD USING THE SAME

(75) Inventor: Shuji Matsumoto, Omihachiman (JP)

(73) Assignee: Murata Manufacturing Co., Ltd. (JP)

( * ) Notice: Subject to any disclaimer, the term of this patent is extended or adjusted under 35 U.S.C. 154(b) by 56 days.

(21) Appl. No.: 09/746,314

(22) Filed: Dec. 21, 2000

(30) Foreign Application Priority Data

Dec. 21, 1999 (JP) .............................. 11-362508
Nov. 16, 2000 (JP) ........................ 2000-349585

(51) Int. Cl.[7] .............................. H01B 1/16; H01B 1/22; H05K 1/09
(52) U.S. Cl. .................... 252/512; 428/901; 174/257
(58) Field of Search ..................... 252/512; 427/96; 428/901; 174/257

(56) References Cited

U.S. PATENT DOCUMENTS 4,399,320 A * 8/1983 Prabhu et al. ............ 174/68.5
4,521,329 A * 6/1985 Siuta et al. ................. 252/512
5,468,695 A * 11/1995 Carroll et al. ................ 501/79

* cited by examiner

*Primary Examiner*—Mark Kopec
(74) *Attorney, Agent, or Firm*—Dickstein, Shapiro, Morin & Oshinsky, LLP

(57) ABSTRACT

A conductive paste which can form a thick film conductor containing no lead, being able to be fired at a middle temperature, superior in conductivity, and having sufficient adhesive strength to a substrate, and a printed wiring board formed using the conductive paste are provided. The conductive paste contains a Cu containing powder; a glass frit; and an organic vehicle, wherein the glass has a composition represented by $xBi_2O_3$—$yB_2O_3$—$zSiO_2$, where x, y, and z are indicated in mole %, and a composition ratio (x, y, z) within the range surrounded by point A (15, 35, 50), point B (25, 60, 15), point C (45, 40, 15) and point D (45, 20, 35) in a ternary compositional diagram, and a mean particle diameter of about 0.1 to 1.0 $\mu$m.

20 Claims, 2 Drawing Sheets

CONDUCTIVE PASTE AND PRINTED WIRING BOARD USING THE SAME

BACKGROUND OF THE INVENTION

1. Field of the Invention

The present invention relates to a conductive paste, and more specifically, it relates to a conductive paste used in order to form an electrode, a wiring pattern, etc., made of a thick film on a substrate, and relates to a printed wiring board formed using the same.

2. Description of the Related Art

In general, so called thick film techniques have been widely used in practice wherein conductive pastes are coated on insulating substrates made of glass, ceramics, etc., by a screen printing method or a direct drawing method, and thereafter these are fired to form desired conductive patterns such as electrodes and wiring patterns.

The conductive pastes used in the thick film techniques can be classified, in accordance with firing temperatures, into high temperature firing types which are fired at about 800° C. to 950° C. and middle temperature firing types which are fired at about 750° C. or less, for example, about 600° C.

When the high temperature firing type conductive pastes are used, it is possible to obtain electrodes and wiring patterns superior in conductive characteristics, in particular, conductivity and adhesiveness to substrates, while there are drawbacks in that printed resistors and dielectrics are thermally damaged.

On the other hand, the middle temperature firing type conductive pastes have advantages in that these can be fired at lower temperatures and therefore electrodes and wiring patterns can be formed without causing large thermal damage to common printed resistors, dielectrics, etc.

In general, the middle temperature firing type conductive pastes are composed of metallic powders and glass frits dispersed in organic vehicles, wherein the metallic powders are sintered during the firing to be thick film conductors, the glass frits enter the liquid state during the firing to improve the sinterability of metals and to function as adhesives of formed thick film conductors and substrates, and the organic vehicles function as organic liquid media for making these powders possible to print.

The function of the aforementioned glass frits of adhering thick film conductors to substrates is called the glass bonding function. The glass frits melt and move to the interface with the substrates during the firing of the conductive pastes to function as adhesives of fired films to substrates.

Therefore, there are more metallic components in the upper layer part of the thick film conductors after firing, and there are more glass components in the lower layer part. Thus the glass fills the role of a mechanical bonding of the substrates and thick film conductors, wherein the glass is in the shape as if it were reaching out its hand between metallic particles from above the surface of the substrates. In the common middle temperature firing type conductive pastes, in order to simplify the pulverizing process of the glass frits, usually, glass frits of about 3 $\mu$m or more in mean diameter are used.

The thick film conductors, however, such as electrodes and wiring patterns, formed using the middle temperature firing type conductive pastes are likely to be inferior in the conductivity characteristics compared to the high temperature firing type conductive pastes.

For example, in the case of the middle temperature firing type conductive pastes using glass frits, the glass frits melt and move to the interface with the substrates during the firing, and pores are formed at the places where the glass frits have been before the firing. Because the pores are formed in accordance with particle diameters of the used glass frits, there are problems in that the conductivity of the obtained thick film conductors may be lowered, the strength of the obtained thick film conductors themselves may be lowered and furthermore, degradation in the tolerance to thermal aging may be caused due to the penetration of solder into the pores.

As the aforementioned middle temperature firing type glass, usually glass containing lead and softening at a low temperature is used. Recent years, however, the environmental pollution by the elution of lead has caused problems, and conductive pastes containing no lead have been required.

SUMMARY OF THE INVENTION

The present invention was made in consideration of the aforementioned circumstances. It is an object of the present invention to provide a conductive paste which can form a thick film conductor containing no lead, able to be fired at a middle temperature, superior in the conductivity and having sufficient adhesive strength to a substrate, and to provide a printed wiring board in which an electrode and a wiring pattern are formed using the conductive paste.

In order to attain the aforementioned objects, a conductive paste according to the present invention is a conductive paste comprising: at least one metallic powder selected from the group consisting of Cu, an alloy containing Cu and a mixture containing Cu; a glass frit; and an organic vehicle, and is characterized in that a glass powder which has a composition represented by the formula $xBi_2O_3$—$yB_2O_3$—$zSiO_2$, where x, y, and z are indicated in mole %, and the composition ratio (x, y, z) of which is within the range surrounded by point A (15, 35, 50), point B (25, 60, 15), point C (45, 40, 15) and point D (45, 20, 35) in a ternary compositional diagram shown in FIG. 1, is used as the glass powder constituting the aforementioned glass frit.

By using the glass frit containing the glass powder which has the composition represented by the formula $xBi_2O_3$—$yB_2O_3$—$zSiO_2$, and the composition ratio (x, y, z) of which is within the range surrounded by point A, point B, point C and point D shown in FIG. 1 as the glass frit, it becomes possible to lower the firing temperature without using the lead glass, and therefore it becomes possible to provide a conductive paste which can form a thick film conductor containing no lead, being superior in conductivity and having sufficient adhesive strength to a substrate even when it was fired at a middle temperature.

That is, by using the glass powder, the composition ratio (x, y, z) of which is within the range surrounded by the point A, point B, point C and point D shown in FIG. 1 as the glass powder, it becomes possible to make it surely function as the liquid phase preventing the increase of the glass softening point and the crystallization of the glass during the firing of the conductive paste, and it becomes possible to improve the sinterability of a metallic powder, being a conductive material, selected from the group consisting of Cu, an alloy containing Cu and a mixture containing Cu, even when it is fired under a non-oxidative atmosphere. Therefore, it becomes possible to lower the firing temperature without using the lead glass, and it becomes possible to provide a conductive paste which can form the thick film conductor containing Cu as a primary component, superior in the conductivity and having sufficient adhesive strength to the substrate even when it was fired at the middle temperature under the non-oxidative atmosphere.

By using the powder (copper material) selected from the group consisting of Cu, the alloy containing Cu and the mixture containing Cu, it becomes possible to suppress the material cost, to reduce the wiring resistance, and to improve the migration characteristics compared to the case in which noble metals, for example, gold, silver, palladium, etc., are used.

Furthermore, it becomes possible to lower the firing temperature to about 700° C. or less, and therefore it becomes possible to reduce the thermal damage to elements such as a resistor formed beforehand on the substrate.

In the conductive paste according to the present invention, a mean particle diameter of the aforementioned glass powder is preferably within the range of about 0.1 to 1.0 μm. By using the glass powder, the mean particle diameter of which is within the range of about 0.1 to 1.0 μm as the glass powder constituting the glass frit, it becomes possible to improve the reactivity with the metallic powder conductive material selected from the group consisting of Cu, the alloy containing Cu and the mixture containing Cu, to improve the sinterability of the metallic powder, and to further lower the firing temperature, and it becomes possible to improve the conductivity of the formed thick film conductor and the strength of the sintered film itself by preventing the formation of large pores in the sintered film, and to suppress the degradation in the tolerance to the thermal aging.

In the conductive paste according to the present invention, the composition ratio (x, y, z) of the aforementioned glass powder represented by the formula $xBi_2O_3$—$yB_2O_3$—$zSiO_2$ is preferably within the range surrounded by point E (25, 30, 45), point F (25, 55, 20), point G (35, 50, 15) and point H (35, 25, 40) in the ternary compositional diagram shown in FIG. 1.

By using the glass powder, the composition ratio (x, y, z) of which is within the range surrounded by the point E, point F, point G and point H shown in FIG. 1 as the glass powder, it becomes possible to more surely lower the glass softening point, to improve the sinterability of the metallic powder conductive material selected from the group consisting of Cu, the alloy containing Cu and the mixture containing Cu, to obtain a thick film conductor superior in conductivity and having sufficient adhesive strength to the substrate, even when it was fired at the middle temperature under the non-oxidative atmosphere.

In the conductive paste according to the present invention, the aforementioned glass powder preferably contains a positive amount of at least one selected from the group consisting of (a) about 40 mole % or less of $ZnO_2$, (b) about 10 mole % or less of an alkali metal oxide and (c) about 20 mole % or less of an alkaline-earth metal oxide relative to 100 mole % of a primary component which has the composition represented by the formula $xBi_2O_3$—$yB_2O_3$—$zSiO_2$ and the composition ratio (x, y, z) of which is within the range surrounded by point A (15, 35, 50), point B (25, 60, 15), point C (45, 40, 15) and point D (45, 20, 35) in the ternary compositional diagram shown in FIG. 1.

By using the glass powder containing at least one selected from the group consisting of (a) about 40 mole % or less of $ZnO_2$, (b) about 10 mole % or less of the alkali metal oxide and (c) about 20 mole % or less of the alkaline-earth metal oxide relative to 100 mole % of the primary component, the composition ratio (x, y, z) of which is within the range surrounded by point A, point B, point C and point D in the ternary compositional diagram shown in FIG. 1, it becomes possible to further lower the glass softening point.

In the conductive paste according to the present invention, the content of the aforementioned glass frit is preferably within the range of about 2 to 15 weight % relative to the whole quantity of the aforementioned conductive paste.

By specifying the content of the glass frit containing the aforementioned glass powder as being within the range of about 2 to 15 weight % relative to the whole quantity of the conductive paste, it becomes possible to more surely provide the conductive paste which can form the thick film conductor superior in the conductivity and having sufficient adhesive strength to the substrate even when it was fired at the middle temperature.

The reason the content of the glass frit is specified as being within the aforementioned range are that when the content of the glass flit is about 2 weight % or less, the effect of being the liquid phase may be insufficient so that the sintering at a low temperature is likely not to proceed, and when the content of the glass frit is more than about 15 weight %, the solderability may be degraded.

The firing temperature of the conductive paste of the present invention is preferably about 700° C. or less.

By providing with the aforementioned characteristic constitutional factors, it becomes possible to lower the firing temperature to about 700° C. or less, it is possible to more surely provide the conductive paste which can surely form the thick film conductor superior in the conductivity and having sufficient adhesive strength to the substrate even when it was fired at the middle temperature under the non-oxidative atmosphere.

The conductive paste according to the present invention is preferably used in order to form an electrode and a wiring pattern of a printed wiring board by printing.

By using the aforementioned conductive paste as the conductive paste in order to form the electrode and the wiring pattern of the printed wiring board by printing, it becomes possible to form a low resistance wiring having sufficient adhesive strength to the substrate and having large film thickness, and it becomes possible to efficiently manufacture the printed wiring board superior in high frequency characteristics.

A printed wiring board according to the present invention is a printed wiring board in which an electrode and a wiring pattern are provided on a substrate, and is characterized in that at least a part of the aforementioned electrode and wiring pattern is formed by coating the conductive paste according to the aforementioned aspects of the present invention and thereafter firing.

In the case in which the electrode and the wiring pattern are formed using the conductive paste according to the present invention, it becomes possible to efficiently form the electrode and the wiring pattern superior in the conductivity and having sufficient adhesive strength to the substrate even when these were fired at the middle temperature, so that it becomes possible to provide printed wiring board low in cost, containing no lead, and being superior in the stability and reliability of the characteristics.

The printed wiring board according to the present invention can be used for functional modules such as a hybrid IC, functional packages, etc., and more specifically, it can be used for single-sided printed wiring substrates, printed wiring boards, multilayer wiring substrates, flexible substrates, ceramic multilayer substrates, etc.

DESCRIPTION OF THE PREFERRED EMBODIMENTS

EXAMPLE 1

The characteristics of the present invention will be further explained in detail using the following example.

Preparation of Conductive Paste (1) As starting materials of the glass component, $Bi_2O_3$, $B_2O_3$ and $SiO_2$ are separately prepared.

Figure 1:
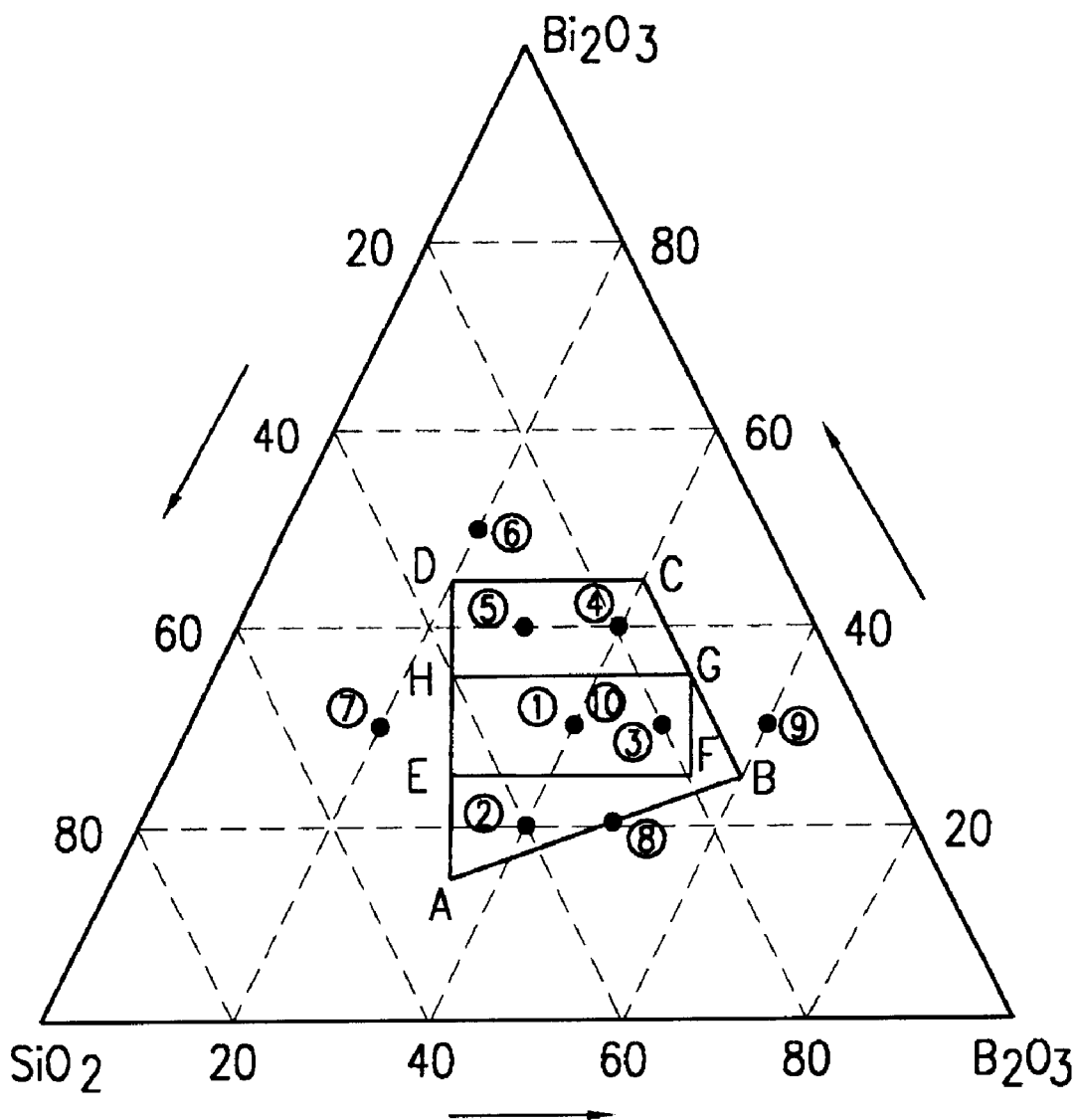
FIG. 1 is a ternary compositional diagram showing a composition ratio of a glass powder used in a conductive paste according to an example (Example 1) of the present invention.

(2) Then, these are mixed in the compositional ratios (mole %) indicated in Table 1 and FIG. 1 to obtain a mixture of the starting materials.

In Table 1, sample numbers 1 to 5 indicate examples and sample numbers 6 to 10 indicate comparative examples.

In FIG. 1, the composition ratios of sample numbers 1 to 10 are indicated by the reference numerals such as ①, ②, ③, wherein the number in the circle is corresponds to the sample number.

TABLE 1

| Sample Number | Composition Ratio (mole %) | | | Mean Particle Diameter |
|---|---|---|---|---|
| | $Bi_2O_3$ | $B_2O_3$ | $SiO_2$ | |
| 1 (Example) | 30 | 40 | 30 | 0.3 μm |
| 2 (Example) | 20 | 40 | 40 | 0.3 μm |
| 3 (Example) | 30 | 50 | 20 | 0.3 μm |
| 4 (Example) | 40 | 40 | 20 | 0.3 μm |
| 5 (Example) | 40 | 30 | 30 | 0.3 μm |
| 6 (Com. Example) | 50 | 20 | 30 | 0.3 μm |
| 7 (Com. Example) | 30 | 20 | 50 | 0.3 μm |
| 8 (Com. Example) | 20 | 50 | 30 | 0.3 μm |
| 9 (Com. Example) | 30 | 60 | 10 | 0.3 μm |
| 10 (Com. Example) | 30 | 40 | 30 | 2.0 μm |

(3) The obtained mixture is melted at a temperature of 1100 to 1300° C. to obtain molten glass.

(4) The molten glass is put into the purified water for quenching, and thereafter is pulverized to obtain a glass powder.

(5) Thus obtained glass powder (glass frit), a copper powder, a copper oxide powder and an organic vehicle are blended in the following ratio and are kneaded to obtain a conductive paste.

| | |
|---|---|
| Copper powder | 76 parts by weight |
| Glass frit | 7 parts by weight |
| Copper oxide powder | 3 parts by weight |
| Organic vehicle | 14 parts by weight |

In this embodiment, an ethyl cellulose resin, an alkyd resin or an acrylic resin dissolved into a terpineol solvent or an alcohol solvent is used as an organic vehicle.

Formation of Thick Film Conductor (1) The conductive paste obtained as described above is coated on an alumina substrate using a screen printing method.

(2) This is dried at 150° C. for 10 minutes.

(3) Thereafter, a thick film conductor is obtained by firing under a $N_2$ atmosphere at a maximum temperature of 600° C. for 1 hour to bake the conductive paste.

Measurement and Evaluation on the Properties of Thick Film Conductor

Regarding the thick film conductor obtained as described above, the resistance (wiring resistance), the initial adhesive strength and the adhesive strength after thermal aging are measured and evaluated. The results are shown in Table 2.

In Table 2, the results of measurement and the results of evaluation on the samples of sample numbers 1 to 5 (Examples) and the samples of sample numbers 6 to 10 (Comparative Examples) are shown.

TABLE 2

| Sample Number | Wiring Resistance (mΩ/□) | Evaluation Result | Initial Adhesive Strength (kgf) | Evaluation Result | Adhesive Strength After Thermal Aging (kgf) | Evaluation Result |
|---|---|---|---|---|---|---|
| 1 (Example) | 2.0 | ○ | 4.0 | ○ | 2.0 | ○ |
| 2 (Example) | 3.0 | ○ | 3.5 | ○ | 1.7 | ○ |
| 3 (Example) | 3.0 | ○ | 3.3 | ○ | 1.5 | ○ |
| 4 (Example) | 3.0 | ○ | 3.2 | ○ | 1.3 | ○ |
| 5 (Example) | 3.0 | ○ | 3.3 | ○ | 1.4 | ○ |
| 6 (Com. Example) | 3.5 | X | 2.8 | X | 0.5 | X |
| 7 (Com. Example) | 3.1 | X | 2.0 | X | 0.9 | X |
| 8 (Com. Example) | 3.5 | X | 3.5 | ○ | 0.7 | X |
| 9 (Com. Example) | 3.5 | X | 2.5 | X | 0.1 | X |
| 10 (Com. Example) | 3.5 | X | 3.5 | ○ | 0.2 | X |

Evaluation criteria

| | | |
|---|---|---|
| wiring resistance: | 3.0 mΩ/□ or less | ○ |
| | more than 3.0 mΩ/□ | X |
| initial strength: | 3.0 kgf or more | ○ |
| | less than 3.0 kgf | X |
| thermal aging strength: | 1.0 kgf or more | ○ |
| | less than 1.0 kgf | X |

The wiring resistance (mΩ/□) shown in Table 2 means the sheet resistance value obtained by measuring two points on a patterned thick film conductor, in the dimension of which, the ratio of the length (L) and the width (W) is made to be 100:1 (L/W=100/1), using the well-known four-terminal method, and thereafter converting the result in terms of film thickness.

The adhesive strength (kgf) shown in Table 2 is obtained by connecting a lead wire, using soldering, to a thick film conductor formed by baking the conductive paste, and thereafter by pulling the lead wire. More specifically, a substrate, on which a thick film conductor 2 mm×2 mm is formed, is immersed into the eutectic solder containing 2% of silver (Ag), the temperature of which is controlled at 235±5° C., for 5±1 sec, and a tinned copper wire 0.8 mm in diameter, which is a lead wire, is connected to the thick film conductor using the soldering, and thereafter the lead wire is pulled by a tension tester at a speed of 20 mm/min to obtain a measured value of the adhesive strength.

In Table 2, the initial adhesive strength and the adhesive strength after thermal aging are indicated. The initial adhesive strength is an adhesive strength just after the soldering of the aforementioned lead wire, and the adhesive strength after thermal aging is an adhesive strength after an aging treatment at a temperature of 150° C. for 1000 hours.

In the evaluation on the wiring resistance shown in Table 2, the evaluation criterion value is specified to be 3.0 mΩ/□, therefore the case in which the wiring resistance indicates this value or less is evaluated to be ○, and in the case more than this value is evaluated to be x.

In the evaluation on the initial adhesive strength shown in Table 2, the evaluation criterion value is specified to be 3.0 kgf; therefore the case in which the initial adhesive strength is 3.0 kgf or more is evaluated to be ○, and when it is less than 3.0 kgf is evaluated to be x.

In the evaluation on the adhesive strength after thermal aging, the evaluation criterion value is specified to be 1.0 kgf; therefore the case in which the adhesive strength after thermal aging is 1.0 kgf or more is evaluated to be ○, and when it is less than 1.0 kgf is evaluated to be x.

It is understood from Table 2 that sample numbers 1 to 5 (Examples) which are within the scope of the present invention fulfill the evaluation criteria in all items, while on the other hand, sample numbers 6 to 10 (Comparative Examples) which are out of the scope of the present invention do not fulfill the evaluation criteria in at least a part of properties.

In the aforementioned example, a thick film conductor formed on an alumina substrate was explained, but the kind of substrate, however, on which the thick film conductor is formed is not limited to this, and even in the case in which the thick film conductor is formed on an insulating substrate made of other material, for example, a low temperature sintered glass ceramic substrate, essentially similar results are obtained.

EXAMPLE 2

Figure 2:
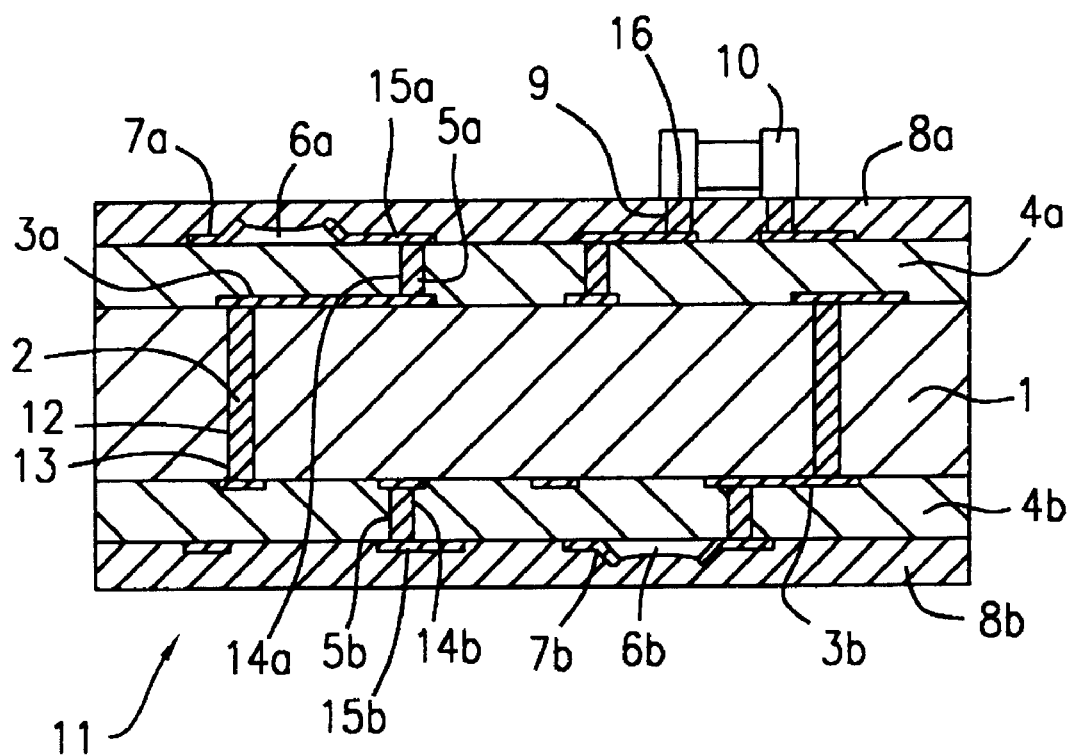
FIG. 2 is a sectional view showing a construction of a printed wiring board according to an example (Example 2) of the present invention.

FIG. 2 is a sectional view of a printed wiring board in which an electrode and a wiring pattern are formed using the conductive paste according to the present invention.

The printed wiring board 11 is provided with a base substrate 1 made of alumina, etc., the first insulating layers 4a and 4b made of amorphous glass, crystallized glass, glass ceramic mixture, etc., provided on the top and bottom faces thereof, and the second insulating layers (protective layer) 8a and 8b provided on the first insulating layers 4a and 4b.

A via hole 2, which is a penetrated hole 12, for a via hole, filled with a conductor 13 containing Ag as a primary component, is provided in the base substrate 1, and the first circuit patterns (wiring pattern) 3a and 3b, containing Ag as a primary component, formed using the conductive paste containing Ag as a primary component, are provided on the top and bottom faces of the base substrate 1 (the boundary faces between the base substrate 1 and the first insulating layers 4a and 4b).

Via holes 5a and 5b, which are penetrated holes 14a and 14b, for via holes, filled with conductors 15a and 15b containing Ag as a primary component, are provided in the first insulating layers 4a and 4b, resister patterns 6a and 6b made of, for example, ruthenium oxide ($RuO_2$), are provided on the surfaces of the first insulating layers 4a and 4b (the boundary faces between the first insulating layers 4a and 4b and the second insulating layers 8a and 8b), and the second circuit patterns (wiring pattern) 7a and 7b, which are conducted to the resister patterns 6a and 6b, and also are conducted to the conductors 15a and 15b in the via holes 5a and 5b, are provided. The second circuit patterns (wiring pattern) 7a and 7b are formed using the conductive paste according to the present invention (conductive paste containing a copper powder as a conductive component according to one of sample numbers 1 to 5 in the aforementioned Example 1).

In the printed wiring board 11 according to the present embodiment, a mounting part (chip coil, chip capacitor, chip resistor, etc.) 10 is mounted, conducting to the circuit pattern (wiring pattern) 7b via the solder 9 filled into a penetrated hole 16, for a via hole, formed in the second insulating layer 8a, on the surface of the second insulating layer 8a (that is, the top face of the printed wiring board 11).

Next, a manufacturing method of the aforementioned printed wiring board 11 will be explained.

(1) The base substrate 1 is prepared. As the base substrate 1, for example, an alumina fired board and a low temperature firing ceramic fired board about 0.5 mm thick, can be used.

(2) The penetrated hole 12, for a via hole, is formed in the base substrate 1. The penetrated hole 12 for the via hole can be formed by, for example, a laser material processing method.

(3) The penetrated hole 12, for the via hole, is filled with an Ag conductive paste and is fired in air at a temperature of about 850° C. to form the via hole 2 filled with the conductor 13 containing Ag as a primary component.

(4) The Ag conductive paste is screen printed on the surface (both faces) of the base substrate 1, and is fired in air at a temperature of about 850° C. to form the first circuit patterns 3a and 3b, containing Ag as a primary component, on the top and bottom faces of the base substrate 1.

(5) An insulating paste is screen printed, and the penetrated holes 14a and 14b, for the via hole, are provided to form the first insulating layers 4a and 4b.

(6) The penetrated holes 14a and 14b, for the via hole, are filled with the Ag conductive paste and are fired in air at a temperature of about 850° C. to form the via holes 5a and 5b filled with the conductors 15a and 15b containing Ag as a primary component.

(7) A ruthenium oxide ($RuO_2$) resistive paste is screen printed on the surface of the first insulating layers 4a and 4b, and is fired in air at a temperature of about 850° C. to form the resister patterns (thick film resistor) 6a and 6b.

(8) The conductive paste according to the present invention (conductive paste according to one of sample numbers 1 to 5 in the aforementioned Example 1) is fired under a non-oxidative atmosphere (nitrogen atmosphere) at about 600° C. to form the second circuit patterns 7a and 7b on the surface of the first insulating layers 4a and 4b.

(9) The insulating paste is coated by the screen printing method, etc., on the surface of the first insulating layers 4a and 4b, the penetrated hole 16, for the via hole, is formed, and thereafter by the firing in air at about 500 to 550° C., the second insulating layers (protective layer) 8a and 8b are formed.

(10) The solder (for example, cream solder) 9 is filled into the penetrated hole 16, for the via hole, the mounting part 10 is mounted, and the mounting part 10 is connected by a reflow soldering to obtain the printed wiring board 11 shown in FIG. 2.

In the Example 2, because the circuit pattern (the second circuit patterns 7a and 7b) is formed using the conductive paste according to the present invention, it becomes possible to efficiently form the electrode and the wiring pattern fired at a relatively low temperature, being superior in the conductivity and having sufficient adhesive strength to a substrate, and it is possible to efficiently manufacture the printed wiring board low in the wiring resistance, superior in the high frequency characteristics, causing a little thermal damage to the resistor pattern formed beforehand, and being superior in reliability.

In the aforementioned example, only the second circuit patterns 7a and 7b are formed using the conductive paste according to the present invention; the first circuit patterns 3a and 3b, however, can also be formed using the conductive paste according to the present invention.

The printed wiring board 11 according to the present invention manufactured as described above can be used for functional modules such as a hybrid IC, functional packages, etc., and more specifically, it can be widely used for single-sided printed wiring substrates, printed wiring boards, multilayer wiring substrates, flexible substrates, ceramic multilayer substrates, etc.

In the aforementioned example, copper powder was used as the conductive material but besides the copper powder, however, metallic powders selected from the group consisting of the alloy containing Cu and the mixture containing Cu can be used.

The kind of glass powder and the kind of organic vehicle constituting the glass frit are not limited to the aforementioned embodiment, and other kinds of glass powder and organic vehicle can be used.

The present invention is not limited to the aforementioned embodiment in other points, and regarding the composition ratio of the glass powder, the particle diameter of the glass powder, the content of the glass frit, the firing temperature in the firing process, etc., various applications and modifications within the scope of the present invention can be encompassed.

Because the conductive paste according to the present invention uses the glass frit containing the glass powder which has the composition represented by the formula $xBi_2O_3$—$yB_2O_3$—$zSiO_2$, and the composition ratio (x, y, z) of which is within the range surrounded by point A, point B, point C and point D shown in FIG. 1 as the glass frit, it becomes possible to lower the firing temperature without using the lead glass, and therefore it becomes possible to provide a conductive paste which can form a thick film conductor containing no lead, superior in conductivity, and having sufficient adhesive strength to the substrate even when it was fired at the middle temperature.

That is, by using the glass powder, the composition ratio (x, y, z) of which is within the range surrounded by point A, point B, point C and point D shown in FIG. 1 as the glass powder, it becomes possible to make it surely function as the liquid phase, preventing an increase of the glass softening point and the crystallization of the glass during the firing of the conductive paste, and it becomes possible to improve the sinterability of the metallic powder conductive material selected from the group consisting of Cu, the alloy containing Cu and the mixture containing Cu. Therefore, it becomes possible to lower the firing temperature without using the lead glass, and it becomes possible to provide the conductive paste which can form the thick film conductor superior in conductivity and having sufficient adhesive strength to the substrate even when it was fired at the middle temperature.

By using the powder (copper material) selected from the group consisting of Cu, the alloy containing Cu and the mixture containing Cu, it becomes possible to suppress the material cost compared to the case in which noble metals, for example, gold, silver, palladium, etc., are used, and it becomes possible to form a wiring low in wiring resistance and superior in the migration characteristics.

When a silver paste, containing a silver powder as a conductive material, generally used in the formation of wiring, etc., is used, the firing temperature is usually about 800° C. In the case, however, in which the conductive paste of the present invention containing the aforementioned copper material as the conductive material, it becomes possible to lower the firing temperature to about 700° C. or less, and therefore it becomes possible to reduce the thermal damage to the elements formed beforehand on the substrate.

In the case in which the glass powder, the mean particle diameter of which is within the range of about 0.1 to 1.0 μm, is used as the glass powder constituting the glass frit, it becomes possible to improve the reactivity with the powder conductive material selected from the group consisting of Cu, the alloy containing Cu and the mixture containing Cu, and to improve the sinterability of the powder. Furthermore, it becomes possible to improve the conductivity of the formed thick film conductor and the strength of the sintered film itself by preventing the formation of large pores in the sintered film, and to suppress the degradation in the tolerance to the thermal aging.

In the case in which the glass powder, the composition ratio (x, y, z) of which is within the range surrounded by point E, point F, point G and point H shown in FIG. 1 is used, it becomes possible to more surely lower the glass softening point, and to improve the sinterability of the powder conductive material selected from the group consisting of Cu, the alloy containing Cu and the mixture containing Cu. Then it becomes possible to obtain the conductive paste which can form a thick film conductor superior in the conductivity and having sufficient adhesive strength to the substrate, even when it was fired at the middle temperature.

In the case in which the glass powder contains at least one selected from the group consisting of (a) about 40 mole % or less of $ZnO_2$, (b) about 10 mole % or less of an alkali metal oxide and (c) about 20 mole % or less of an alkaline-earth metal oxide, relative to 100 mole % of the primary component, the composition ratio (x, y, z) of which is within the range surrounded by point A, point B, point C and point D shown in FIG. 1, it becomes possible to further lower the glass softening point and to make the present invention more effective in practice.

In the case in which the content of the glass frit containing the aforementioned glass powder is specified as being within the range of about 2 to 15 weight % relative to the whole quantity of the conductive paste, it becomes possible to more surely obtain the conductive paste which can form a thick film conductor superior in the conductivity and having sufficient adhesive strength to the substrate even when it was fired at the middle temperature.

By providing with the aforementioned constitutional factors, it becomes possible to lower the firing temperature to about 700° C. or less, and it becomes possible to surely form a thick film conductor superior in the conductivity and having sufficient adhesive strength to the substrate even when it was fired at the middle temperature.

By using the conductive paste according to the present invention as the conductive paste in order to form the wiring of the printed wiring board by printing, it becomes possible to form a low resistance wiring having sufficient adhesive strength to the substrate and having large film thickness, and it becomes possible to efficiently manufacture a printed wiring board superior in the high frequency characteristics.

Because, in the printed wiring board of the present invention, the electrode and the wiring pattern are formed using the conductive paste according to the present invention, it becomes possible to efficiently form the electrode and the wiring pattern superior in the conductivity and having sufficient adhesive strength to the substrate even when it was fired at the middle temperature, and it becomes possible to provide the printed wiring board being low in the cost, containing no lead and being superior in reliability.

That is, because, in the printed wiring board of the present invention, the electrode and the wiring pattern are formed using the aforementioned conductive paste according to the present invention, it becomes possible to control the resistance (wiring resistance) of the electrode and the wiring pattern at a low level, and to improve the high frequency characteristics. It becomes possible to increase the initial adhesive strength of the conductive paste to improve the precision of the electrode and the wiring pattern, and it becomes possible to increase the adhesive strength after thermal aging of the electrode and the wiring pattern. Furthermore, it becomes possible to extremely reduce the damage to printed resistors, dielectrics, etc., during the firing process, and the reliability of the resistors, dielectrics, etc., can be improved.

What is claimed is:

1. A conductive paste comprising at least one metallic powder selected from the group consisting of Cu, a Cu alloy and a mixture containing Cu; a glass frit; and an organic vehicle; characterized in that the glass has a composition represented by the formula $xBi_2O_3$—$yB_2O_3$—$zSiO_2$, where x, y, and z are in mole %, and the composition ratio (x, y, z) of which is within the range surrounded by point A (15, 35, 50), point B (25, 60, 15), point C (45, 40, 15), and point D (45, 20, 35) in a ternary compositional diagram thereof.

2. A conductive paste according to claim 1, characterized in that a mean particle diameter of said glass is within the range of about 0.1 to 1.0 µm.

3. A conductive paste according to claim 2, characterized in that the composition ratio (x, y, z) of said glass powder is within the range surrounded by point E (25, 30, 45), point F (25, 55, 20), point G (35, 50, 15) and point H (35, 25, 40) in the ternary compositional diagram.

4. A conductive paste according to claim 3, characterized in that said glass contains a positive amount of at least one member selected from the group consisting of (a) about 40 mole % or less of $ZnO_2$, (b) about 10 mole % or less of an alkali metal oxide and (c) about 20 mole % or less of an alkaline-earth metal oxide, relative to 100 mole % of the glass component represented by the formula $xBi_2O_3$—$yB_2O_3$—$zSiO_2$.

5. A conductive paste according to claim 4, characterized in that said glass frit is about 2 to 15 weight % based on the weight of said conductive paste.

6. A conductive paste according to claim 5, characterized by being firable at a firing temperature of about 700° C. or less.

7. A conductive paste according to claim 6, characterized in being firable under a non-oxidative atmosphere.

8. A printed wiring board comprising at least one electrode or wiring pattern on a substrate, characterized in that at least a part of said electrode or wiring pattern is a fired conductive paste according to claim 7.

9. A printed wiring board comprising at least one electrode or wiring pattern on a substrate, characterized in that at least a part of said electrode or wiring pattern is a fired conductive paste according to claim 2.

10. A conductive paste according to claim 1, characterized in that the composition ratio (x, y, z) of said glass powder is within the range surrounded by point E (25, 30, 45), point F (25, 55, 20), point G (35, 50, 15) and point H (35, 25, 40) in the ternary compositional diagram.

11. A printed wiring board comprising at least one electrode or wiring pattern on a substrate, characterized in that at least a part of said electrode or wiring pattern in a fired conductive paste according to claim 10.

12. A conductive paste according to claim 1, characterized in that said glass contains a positive amount of at least one member selected from the group consisting of (a) about 40 mole % or less of $ZnO_2$, (b) about 10 % or less of an alkali metal oxide and (c) about 20 mole % or less of an alkaline-earth metal oxide, relative to 100 % of the glass component represented by the formula $xBi_2O_3$—$yB_2O_3$—$zSiO_2$.

13. A printed wiring board comprising at least one electrode or wiring pattern on a substrate, characterized in that at least a part of said electrode or wiring pattern is a fired conductive paste according to claim 12.

14. A conductive paste according to claim 1, characterized in that said glass frit is about 2 to 15 weight % based on the weight of said conductive paste.

15. A printed wiring board comprising at least one electrode or wiring pattern on a substrate, characterized in that at least a part of said electrode or wiring pattern is a fired conductive paste according to claim 14.

16. A conductive paste according to claim 1, characterized by being firable at a firing temperature of about 700° C. or less.

17. A conductive paste according to claim 1, characterized in being firable under a non-oxidative atmosphere.

18. A conductive paste according to claim 1, characterized in said powder is Cu.

19. A printed wiring board comprising at least one electrode or wiring pattern on a substrate, characterized in that at least a part of said electrode or wiring pattern is a fired conductive paste according to claim 18.

20. A printed wiring board comprising at least one electrode or wiring pattern on a substrate, characterized in that at least a part of said electrode or wiring pattern is a fired conductive paste according to claim 1.

* * * * *